United States Patent [19]

Sharp

[11] Patent Number: 4,704,505
[45] Date of Patent: Nov. 3, 1987

[54] ELECTRICAL APPARATUS CONFIGURED FOR PREDETERMINED ENCODING

[75] Inventor: Larry L. Sharp, Rolling Meadows, Ill.

[73] Assignee: Illinois Tool Works Inc., Chicago, Ill.

[21] Appl. No.: 893,888

[22] Filed: Aug. 6, 1986

[51] Int. Cl.⁴ .............................................. H01H 9/02
[52] U.S. Cl. .................................... 200/61.08; 361/412
[58] Field of Search ............................ 200/61.08, 158;
339/18 R, 18 B, 18 C, 18 P, 19, 247, 222;
361/401, 403, 395, 412, 413

[56] References Cited

U.S. PATENT DOCUMENTS

| | | | |
|---|---|---|---|
| 2,801,399 | 7/1957 | Dunn et al. | 339/222 X |
| 3,524,960 | 8/1970 | Lohff | 200/158 |
| 4,403,126 | 9/1983 | DeHaitre | 200/158 |

Primary Examiner—A. D. Pellinen
Assistant Examiner—Morris Ginsburg
Attorney, Agent, or Firm—D. D. Mondul; T. W. Buckman

[57] ABSTRACT

An electrical apparatus configured for predetermined encoding. The apparatus is comprised of a substrate, a plurality of pairs of electrical terminals affixed to the substrate, a plurality of conductive circuit traces connecting respective pairs of terminals, and a like plurality of removable plugs in the substrate intermediate respective pairs of terminals. The conductive circuit traces respectively traverse respective plugs intermediate respective pairs of terminals so that removal of a plug interrupts the electrical continuity of the conductive circuit trace traversing that plug, thereby creating an electrical open circuit between the respective terminal pair. In such manner, logical "zeroes" (opens) can be created in the respective terminal pairs or, by electing not to remove a given plug a logical "one" (closed electrical circuit) can be programmed between a given electrical terminal pair. While the apparatus is intended, in its preferred embodiment, to be a one-time programmable apparatus, field repairs of the apparatus can be effected by replacing a plug with a segment of a conductive circuit trace carried thereon with the segment of the conductive circuit trace aligned with the remaining portions of the conductive circuit trace and effecting electrical connection between the removed segment and the remaining portions of the conductive circuit trace to re-effect electrical continuity between the respective terminal pair.

4 Claims, 4 Drawing Figures

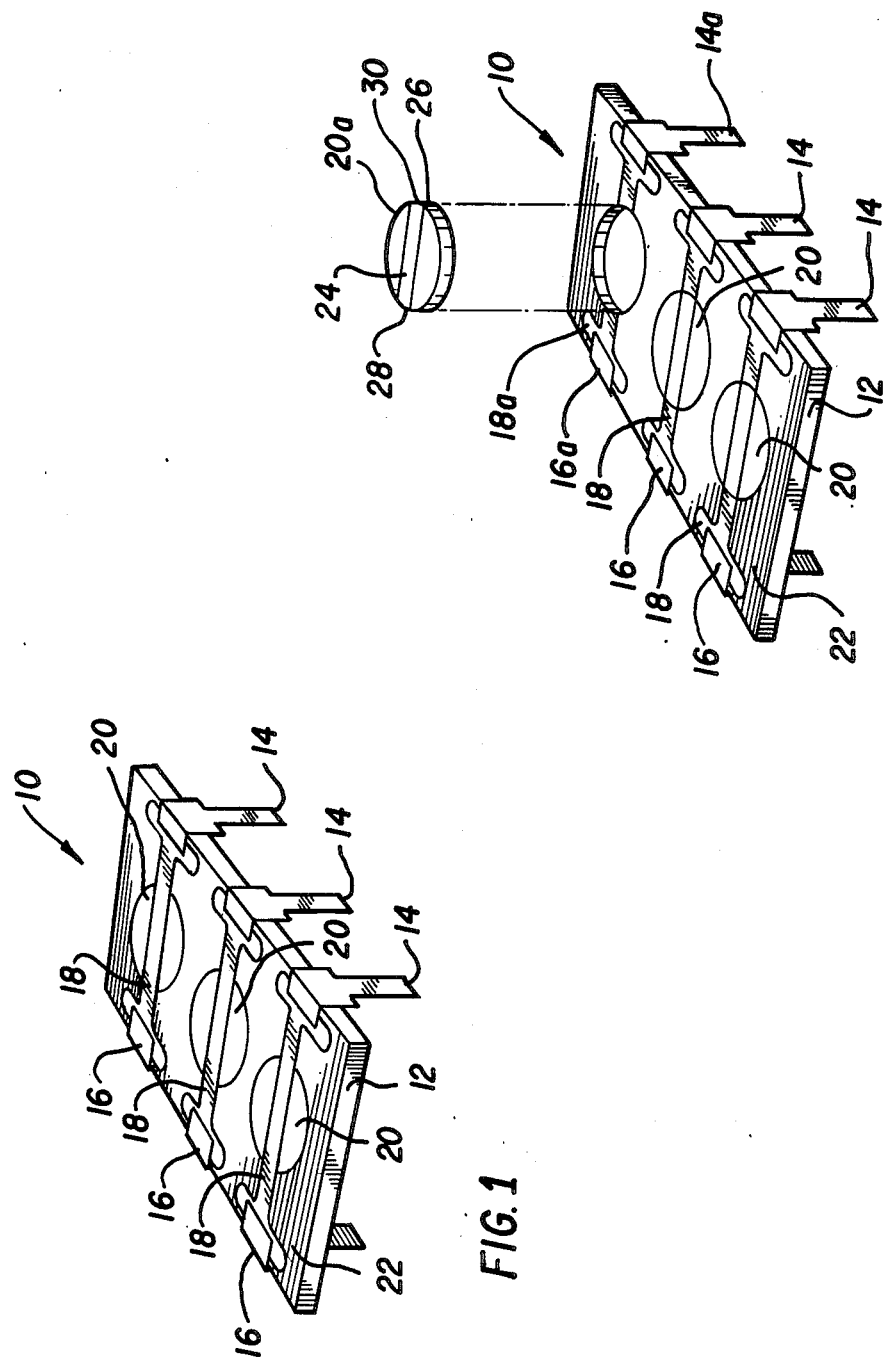

ELECTRICAL APPARATUS CONFIGURED FOR PREDETERMINED ENCODING

BACKGROUND OF THE INVENTION

The present invention is directed to an electrical apparatus capable of predetermined binary encoding. The apparatus of the present invention is most advantageously employed as a one-time predetermined encoded array of electrical circuit segments. The apparatus is usable as a direct substitute for what is presently known in the art as a programmable DIP (dual in-line programmable) switch. The present invention is configured, in its preferred embodiment, as a one-time preprogrammable DIP switch replacement device providing a low cost alternative to a DIP switch with a plurality of independent reprogrammable switch devices while retaining the coding function as well as providing a simple and durable device.

SUMMARY OF THE INVENTION

The invention is an electrical apparatus configured for predetermined binary encoding of a plurality of circuit segments. In the preferred embodiment, the invention of the present application provides a substrate with a plurality of removable plug segments across which are established a like plurality of electrically conductive paths. Each of the electrically conductive paths connects a pairs of terminals, thus providing a plurality of electrical circuit segments composed of a pair of terminals connected by an electrically conductive path traversing a plug in the substrate. Removal of the plug from the substrate breaks the electrically conductive path and creates an open circuit between the affected terminal pairs, thus providing a logical "zero" for that particular circuit segment. Circuit segments from which the respective plug has not been removed provide an electrically conductive path between the respective terminal pairs, thereby providing a logical "one" for that respective circuit segment.

It is therefore an object of this invention to provide an electrical apparatus configured for predetermined encoding which is simple in construction and provides reliability and durability in its operation.

A further object of this invention is to provide an electrical apparatus configured for predetermined encoding which is inexpensive to construct.

Further objects and features of the present invention will be apparent from the following specification and claims when considered in connection with the accompanying drawings illustrating the preferred embodiment of the invention.

DETAILED DESCRIPTION OF THE DRAWINGS

FIG. 1 is a schematic perspective drawing of the preferred embodiment of the present invention.

FIG. 2 is a schematic perspective drawing of a first embodiment of the present invention with one plug removed from the substrate illustrating the pre-encoding feature of the present invention.

DETAILED DESCRIPTION OF THE INVENTION

Figure 3:
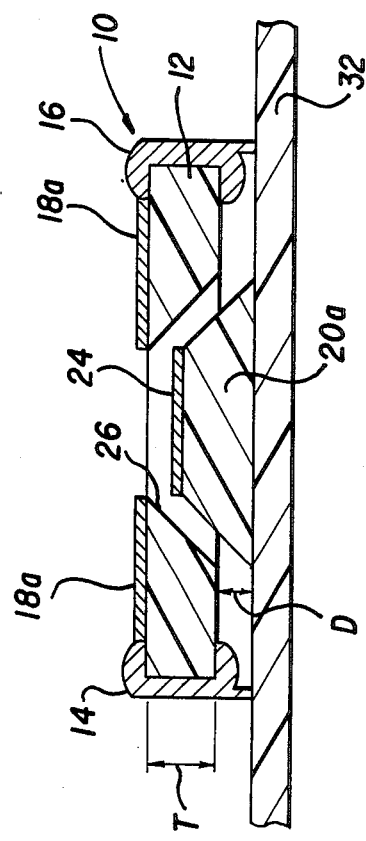
FIG. 3 is a schematic section drawing of the preferred embodiment of the present invention illustrating the preferred configuration providing for captively retaining a removed plug after its removal.

The preferred embodiment of an electrical apparatus 10 configured for predetermined encoding is shown in FIG. 1. The electrical apparatus 10 is comprised of a non-conductive substrate 12 to which are affixed a plurality of conductive terminals 14 and 16.

Connecting each respective pair of terminals 14, 16 is a conductive electrical circuit path 18.

Intermediate each respective pair of terminals 14, 16 is a precut plug 20 in the substrate 12. The plugs 20 are preferably die cut with a slight chamfer in order that they may be removable from the substrate 12 in only one direction. The chamfer may be cut in a manner allowing removal of the plugs 20 only from the top 22 of the substrate 12, or it may be cut in a manner allowing removal of the plugs 20 only from beneath the substrate 12.

Thus, in the manufacture of the preferred embodiment of the present invention, a substrate 12 first has a plurality of plugs 20 die-cut therefrom to form the plugs 20 with a chamfer 26 (in FIG. 2) allowing the plugs 20 to be reinserted in the substrate 12 from the top 22 of the substrate 12 or from beneath the substrate 12. The electrically conductive paths 18 are then applied to the top 22 of the substrate 12, preferably by application of PTF (polymer thick film) material through a screen printing process. Thereafter, the terminals 14, 16 are affixed to the substrate 12 in a manner providing electrical contact between the terminals 14, 16 and their respective conductive circuit paths 18.

For purposes of clarity, like elements will be identified by like reference numerals in the various views of the drawings.

Referring to FIG. 2, the electrical apparatus 10 is illustrated with one plug 20a of the plurality of plugs 20 removed from the top 22 of the substrate 12. As is clearly shown in FIG. 2, removal of the plug 20a from the substrate 12 interrupts the conductive circuit path 18a thereby creating an open electrical circuit between the terminal pair 14a, 16a. A segment 24 of the conductive circuit path 18a is carried away with the plug 20a and is discarded with the plug 20a. The chamfer 26 of the plug 20a is clearly evident in FIG. 2. The purpose of the chamfer 26 is to ensure that the plug 20a is removable from the substrate 12 only in one direction as, for example in FIG. 2, from the top 22 of the substrate 12.

By removing the plug 20a, as illustrated in FIG. 2, an open electrical circuit (i.e. a logical "zero") is created between the terminal pairs 14a, 16a. The remaining terminal pairs 14, 16 in FIG. 2 have a closed electrical circuit (i.e. a logical "one") between them through their respective conductive circuit paths 18.

FIG. 3 illustrates the most preferred embodiment of the present invention. In this most preferred embodiment the chamfer 26 is oriented to ensure that the plug 20a is removable only from beneath the substrate 12. Further, the conductive terminals 14, 16 are configured in a manner known in the art (not shown) to ensure that, when the apparatus 10 is installed upon a mounting substrate 32, a gap D is established between the mounting substrate 32 and the substrate 12. So long as the gap D is less than the thickness T of the substrate 12, the plug 20a, when dislodged from the substrate 12, is captively retained between the substrate 12 and the mounting substrate 32, thereby precluding loose plugs 20 from fouling, shorting, or otherwise disrupting circuitry within a device in which the apparatus 10 is installed.

While the present invention is intended to be used as a one-time programmable electrical apparatus, reconnection of the conductive circuit path 18a could be effected by replacement of the plug 20a with the segment 24 aligned with the remaining portions of the conductive circuit path 18a on the top 22 of the substrate 12 and re-effecting connection of the segment 24 to the conductive circuit path 18a at the two ends 28 and 30 which are contiguous to the remaining portions of the conductive circuit path 18a. Such a connection could be effected by a bridging solder joint or, in the case of a PTF conductive circuit path 18a, by painting conductive ink across the junction between the remaining portions of conductive circuit path 18a and the ends 28 and 30 of the segment 24, thereby re-establishing electrical continuity between the remaining portions of conductive circuit path 18a and the removed segment 24.

Figure 4:
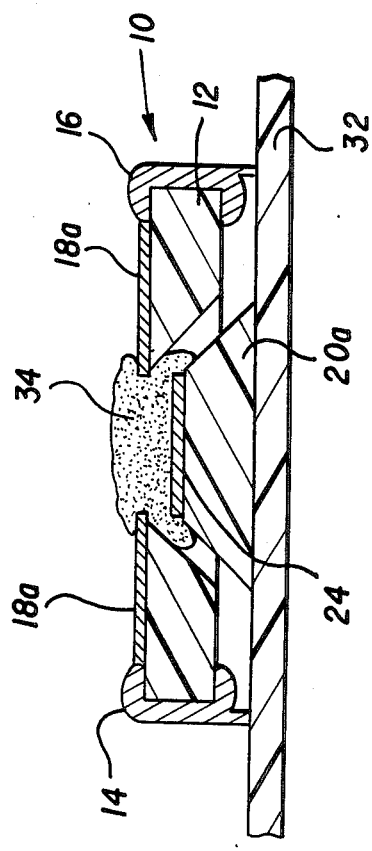
FIG. 4 is a schematic section drawing of the preferred embodiment of the present invention illustrating field reconnection of an electrical circuit path.

FIG. 4 illustrates that, when the plug 20a is captively held, after removal from the substrate 12, between the substrate 12 and a mounting substrate 32, re-effecting connection of the segment 24 to the conductive circuit path 18a may be accomplished by applying a conductive material 34, such as conductive epoxy, in a sufficient amount to electrically connect the segment 24 to the remaining portions of the conductive circuit path 18a.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims.

I claim:

1. An electrical apparatus configured for predetermined encoding comprising a substrate, at least one removable substrate section in said substrate, a plurality of termination means for accommodating electrical access to the apparatus, and at least one electrically conductive path means; said at least one electrically conductive path means establishing an electrical connection between at least two of said plurality of termination means and traversing said at least one removable section whereby removal of said at least one removable section from said substrate interrupts at least one of said at least one electrically conductive path means.

2. An electrical apparatus configured for predetermined encoding as recited in claim 1 wherein said at least one removable section is a plurality of removable sections and said plurality of termination means comprises a plurality of pairs of terminals equal in number to said plurality of removable sections.

3. An electrical apparatus configured for predetermined encoding as recited in claim 2 wherein said at least one electrically conductive path means is a plurality of path means equal in number to said plurality of removable sections.

4. An electrical apparatus configured for predetermined encoding as recited in claim 3 wherein each of said plurality of removable sections has associated therewith one of said plurality of pairs of terminals and one of said plurality of path means, thereby establishing a plurality of binary encodeable circuit segments.

* * * * *